United States Patent
Shih et al.

(10) Patent No.: US 9,123,651 B2
(45) Date of Patent: Sep. 1, 2015

(54) DENSE OXIDE COATED COMPONENT OF A PLASMA PROCESSING CHAMBER AND METHOD OF MANUFACTURE THEREOF

(71) Applicant: Lam Research Corporation, Fremont, CA (US)

(72) Inventors: Hong Shih, Walnut, CA (US); Lin Xu, Katy, TX (US); John Michael Kerns, Livermore, CA (US); William Charles, Los Altos, CA (US); John Daugherty, Fremont, CA (US); Sivakami Ramanathan, Fremont, CA (US); Russell Ormond, San Jose, CA (US); Robert G. O'Neill, Fremont, CA (US); Tom Stevenson, Morgan Hill, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 44 days.

(21) Appl. No.: 13/851,605

(22) Filed: Mar. 27, 2013

(65) Prior Publication Data

US 2014/0295670 A1    Oct. 2, 2014

(51) Int. Cl.
*H01L 21/3065* (2006.01)
*H01L 21/02* (2006.01)
*C25D 11/02* (2006.01)
*C23C 16/44* (2006.01)

(52) U.S. Cl.
CPC ........ *H01L 21/3065* (2013.01); *C23C 16/4404* (2013.01); *C25D 11/026* (2013.01); *H01L 21/02274* (2013.01); *Y10T 428/1259* (2015.01); *Y10T 428/12479* (2015.01); *Y10T 428/12549* (2015.01)

(58) Field of Classification Search
USPC .................. 118/715; 428/216, 332, 701, 702
See application file for complete search history.

(56) References Cited

U.S. PATENT DOCUMENTS

| | | | |
|---|---|---|---|
| 6,197,178 B1 | 3/2001 | Patel et al. | |
| 6,365,028 B1 * | 4/2002 | Shatrov | 205/102 |
| 6,805,952 B2 | 10/2004 | Chang et al. | |
| 6,808,613 B2 | 10/2004 | Beauvir | |
| 6,896,785 B2 * | 5/2005 | Shatrov et al. | 205/109 |
| 6,899,109 B1 | 5/2005 | Nguyen | |

(Continued)

FOREIGN PATENT DOCUMENTS

CA         2540340      *  9/2007

OTHER PUBLICATIONS

Blanchard, P.J., "Evaluation of Corrosion Protection Methods for Magnesium Alloys in Automotive Applications", Magnesium Technology, 2005, TMS (The Minerals, Metals & Materials Society), 2005.

(Continued)

*Primary Examiner* — Archene Turner
(74) *Attorney, Agent, or Firm* — Buchanan, Ingersoll & Rooney PC

(57) ABSTRACT

A method of forming a dense oxide coating on an aluminum component of semiconductor processing equipment comprises cold spraying a layer of pure aluminum on a surface of the aluminum component to a predetermined thickness. A dense oxide coating is then formed on the layer of pure aluminum using a plasma electrolytic oxidation process, wherein the plasma electrolytic oxidation process causes the layer of pure aluminum to undergo microplasmic discharges, thus forming the dense oxide coating on the layer of pure aluminum on the surface of the aluminum component.

12 Claims, 2 Drawing Sheets

(56) References Cited

U.S. PATENT DOCUMENTS

Figure 1A:
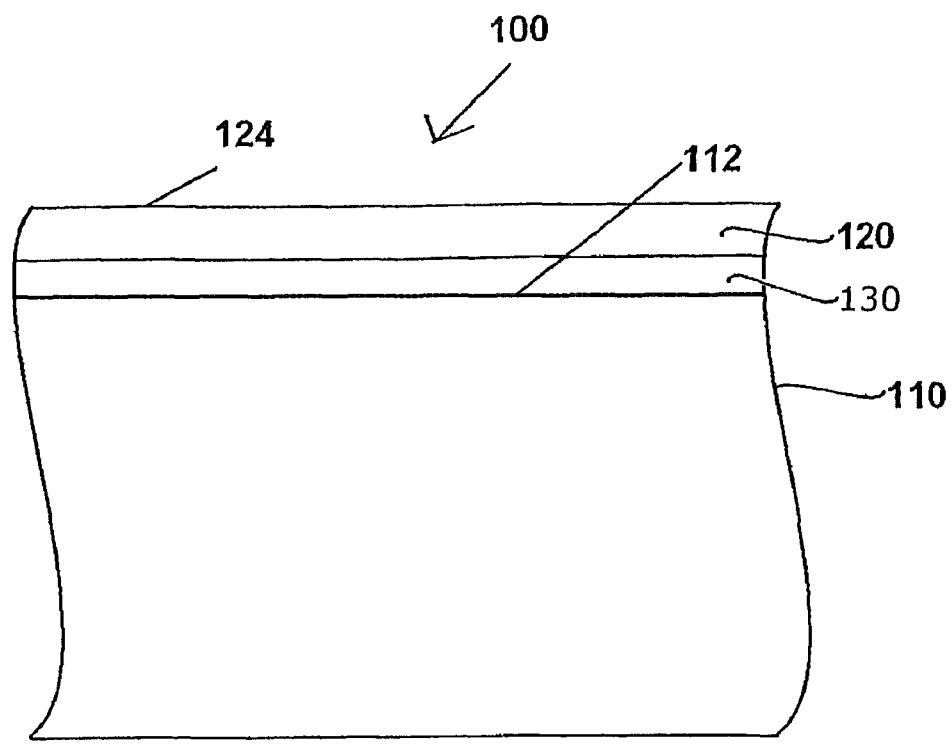

| | | | |
|---|---|---|---|
| 6,974,523 | B2 | 12/2005 | Benzing et al. |
| 7,207,373 | B2 * | 4/2007 | Parkos et al. ............... 164/369 |
| 7,291,566 | B2 | 11/2007 | Escher et al. |
| 7,311,797 | B2 | 12/2007 | O'Donnell et al. |
| 7,396,431 | B2 | 7/2008 | Chen et al. |
| 7,605,086 | B2 | 10/2009 | O'Donnell et al. |
| 8,110,045 | B2 | 2/2012 | Yoneda et al. |
| 8,282,807 | B2 * | 10/2012 | Ohmi et al. ............... 205/224 |
| 8,293,335 | B2 | 10/2012 | Chang |
| 8,313,635 | B2 | 11/2012 | Egley et al. |
| 8,679,252 | B2 * | 3/2014 | Shih et al. ............... 118/715 |
| 8,728,252 | B2 * | 5/2014 | Avelar Batista Wilson et al. ............... 427/248.1 |
| 8,888,982 | B2 * | 11/2014 | Chen et al. ............... 205/190 |
| 2007/0207267 | A1 * | 9/2007 | Laube ............... 118/715 |
| 2009/0200269 | A1 | 8/2009 | Kadkhodayan et al. |
| 2011/0005922 | A1 * | 1/2011 | Tai et al. ............... 204/298.07 |
| 2011/0020665 | A1 | 1/2011 | Serafin et al. |
| 2012/0031765 | A1 * | 2/2012 | Curran et al. ............... 205/50 |
| 2012/0103526 | A1 | 5/2012 | Ouye et al. |

OTHER PUBLICATIONS

Curran, J. A. et al., "The Thermal Conductivity of Plasma Electrolytic Oxide Coatings on Aluminium and Magnesium", Surface and Coatings Technology, v. 199 (2-3), pp. 177-183 (2005).

Dunleavy et al., "Characterisation of discharge events during plasma electrolytic oxidation", Surface and Coatings Technology, 203 (2009), 22: 3410-3419.

Martini, C. et al., "PEO layer obtained from mixed aluminate-phosphate baths on Ti—6Al—4V: Dry sliding behaviour", Wear, 269 (2010), pp. 747-756.

Yerokhin, A. L., "Fatigue properties of Keronite® coatings on a magnesium alloy", Surface and Coatings Technology, 182 (2004), pp. 78-84.

http://en.wikipedia.org/wiki/Plasma_electrolytic_oxidation for PEO Process, pp. 1-3.

Curran, James A., Principal Materials Engineer, "Developments and Approvals on Titanium, Magnesium and Aluminium Composites", Keronite Advanced Surface Technology, ASETSDefense—Feb. 8, 2011, pp. 1-33.

* cited by examiner

DENSE OXIDE COATED COMPONENT OF A PLASMA PROCESSING CHAMBER AND METHOD OF MANUFACTURE THEREOF

FIELD OF THE INVENTION

The present invention relates to components of semiconductor plasma processing chambers, and more specifically for a barrier coating for components of semiconductor plasma processing chambers.

BACKGROUND

In the field of semiconductor material processing, semiconductor plasma processing chambers including vacuum processing chambers are used, for example, for etching and deposition, such as plasma etching or plasma enhanced chemical vapor deposition (PECVD) of various materials on substrates. Some of these processes utilize corrosive and erosive process gases and plasma in such processing chambers. It is desirable to minimize chamber component wear, and particle and/or metal contamination of substrates processed in the chambers. Accordingly, it is desirable that plasma-exposed and/or process gas exposed components of such apparatuses be resistant to corrosion and erosion when exposed to such gases and plasma.

SUMMARY

Disclosed herein is a method of forming a dense oxide coating on an aluminum component of semiconductor processing equipment. The method comprises cold spraying a layer of pure aluminum on a surface of the aluminum component to a predetermined thickness. A dense oxide coating is then formed on the layer of pure aluminum using a plasma electrolytic oxidation process, wherein the plasma electrolytic oxidation process causes the layer of pure aluminum to undergo microplasmic discharges thus forming the dense oxide coating on the layer of pure aluminum on the surface of the aluminum component.

Further disclosed herein is a semiconductor plasma processing apparatus. The semiconductor plasma processing apparatus, comprises a plasma processing chamber in which semiconductor substrates are processed, a process gas source in fluid communication with the plasma processing chamber for supplying a process gas into the plasma processing chamber, and an RF energy source is adapted to energize the process gas into the plasma state in the plasma processing chamber. The semiconductor plasma processing apparatus comprises at least one aluminum component with a dense oxide coating.

Also disclosed herein is a method of plasma processing a semiconductor substrate in a semiconductor plasma processing apparatus comprising at least one aluminum component with a dense oxide coating. The method comprises supplying the process gas from the process gas source into the plasma processing chamber, applying RF energy to the process gas using the RF energy source to generate plasma in the plasma processing chamber, and plasma processing a semiconductor substrate in the plasma processing chamber.

BRIEF DESCRIPTION OF THE DRAWING FIGURES

FIGS. 1A, B illustrate cross sections of an aluminum component with a dense oxide coating of a plasma processing chamber.

Figure 2:
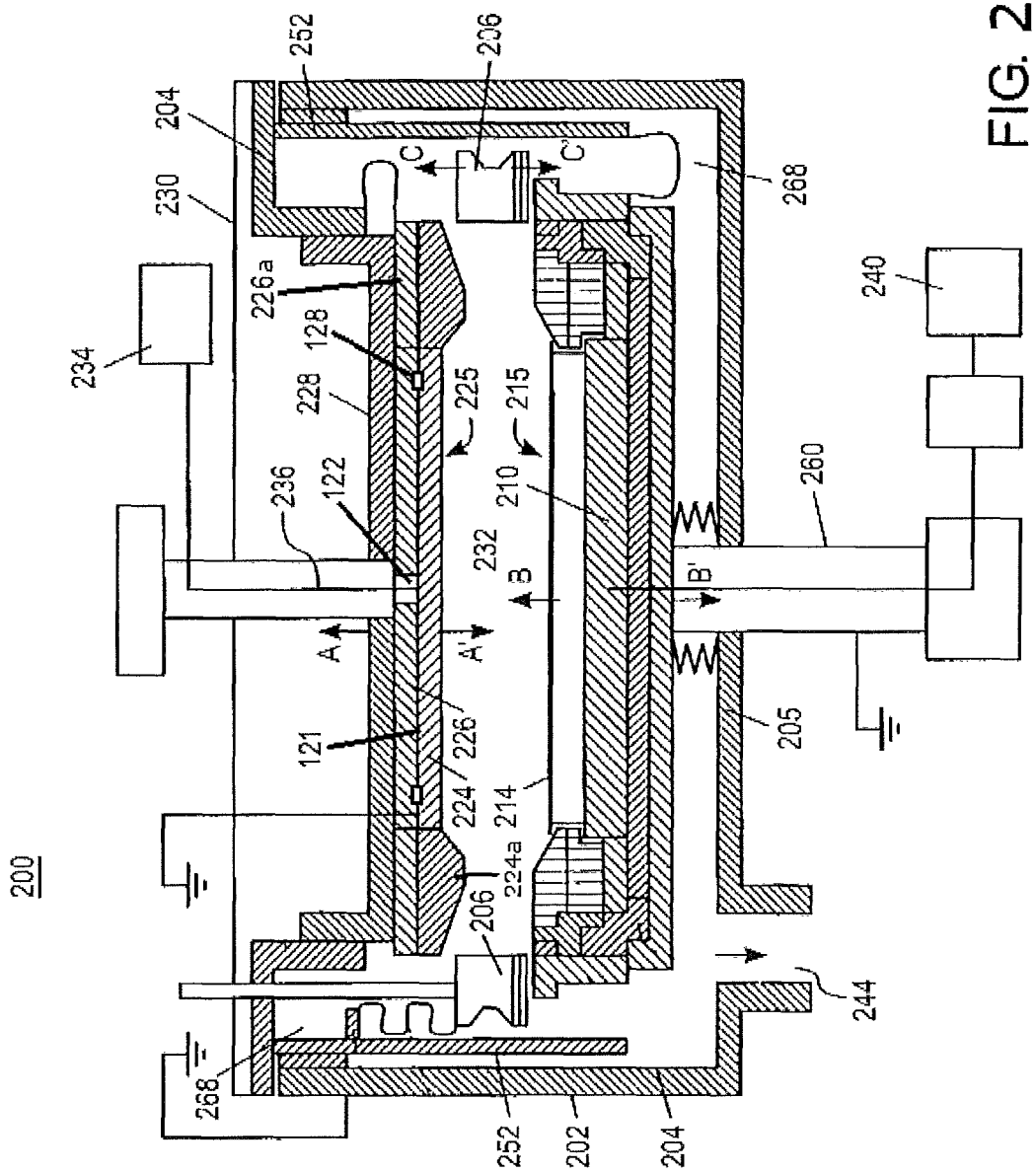

FIG. 2 illustrates an exemplary embodiment of a capacitively coupled plasma etching chamber in which embodiments of the dense oxide coated aluminum components can be installed.

DETAILED DESCRIPTION

Disclosed herein is an aluminum component of a semiconductor plasma processing chamber comprising a dense oxide coating. Dense oxide coatings on aluminum components discussed herein are hard, and erosion and corrosion resistant with respect to physical and/or chemical attacks. Physical and/or chemical attacks can occur by corrosive gases and plasma which are present in plasma processing chambers during processing of semiconductor substrates. Preferably the dense oxide coating has an outer barrier layer thereon, such as a yttrium oxide barrier layer.

The dense oxide coating is formed using a plasma electrolytic oxidation (PEO) process which provides a dense oxide coating that is hard, dense, and corrosion resistant. As used herein, an "aluminum component" is a component formed from aluminum or an aluminum alloy. Additionally, as used herein, "pure aluminum" means a material with at least 99.9% by weight aluminum and more preferably a material with at least 99.93% by weight aluminum. Also as used herein the term "about" refers to ±10%. The dense oxide coating forms a protective layer on a surface of the aluminum component such that contaminates, such as iron impurities which can be found in aluminum components, minimize contamination in the plasma processing chamber. Contamination, such as iron contamination, may occur due to process exposure of the aluminum component during semiconductor plasma processing. The semiconductor plasma processing chamber preferably comprises a vacuum chamber, and may be a plasma etching or deposition chamber (herein referred to as "plasma chamber") of a semiconductor plasma processing apparatus. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure the present embodiments.

Aluminum components described herein may comprise a substrate having at least one aluminum surface, such as an aluminum or aluminum alloy substrate, and a dense oxide coating forming an outer layer on the substrate. To form the dense oxide coating, a layer of pure aluminum is cold sprayed on the aluminum component. The layer of pure aluminum can have a naturally occurring oxide film on exposed surfaces thereof. Then, using plasma electrolytic oxidation (PEO), the dense oxide coating is formed on the pure aluminum layer and grown to a desired thickness. Preferably, the component to be coated with the dense oxide coating is an aluminum component useful in the plasma chamber, such as a chamber wall or a chamber liner. The aluminum surface that is coated can be a plasma exposed or process gas exposed surface such as an exterior surface of the aluminum substrate. The dense oxide coating can be applied on one or more, or on all, exterior surfaces of the aluminum substrate. Alternatively, the dense oxide coating can be applied to an interior surface of the aluminum substrate, such as a gas passage.

During plasma processing, such as etching processes, process gases can be halogen-containing species, e.g., $C_xF_y$ ($x \geq 1$, $y \geq 1$), $C_xH_yF_z$ ($x \geq 1$, $y \geq 1$, $z \geq 1$), HBr, $NF_3$, HBr, $Cl_2$, and $BCl_3$, which are corrosive with respect to aluminum and aluminum alloy surfaces wherein such corrosion may release harmful impurities such as iron which can contaminate semiconductor substrates undergoing processing in the chamber. Therefore, the dense oxide coating may preferably be applied to aluminum or aluminum alloy surfaces forming a hard dense coating that can reduce corrosion of the aluminum and aluminum alloy surfaces, thereby reducing iron contamination in the processing chamber.

Components which include the dense oxide coating can be used in apparatuses for performing various processes including plasma etching of semiconductor substrates and deposition of materials (e.g., ALD, PECVD and the like) used for manufacturing various substrates including, e.g., semiconductor wafers, flat panel display substrates, and the like. Depending on the type and construction of an apparatus, component(s) having at least one aluminum or aluminum alloy surface, and optionally at least one plasma or process exposed surface, can be coated with the dense oxide coating, e.g., chamber walls, chamber liners, baffles, gas distribution plates, gas distribution rings, chucking mechanisms (e.g., electrostatic chucks and aluminum heat sinks), edge rings, gas nozzles, fasteners, shrouds, confinement rings, and the like. The components can include one or more surfaces coated with the dense oxide coating which is corrosion resistant. In some embodiments, the entire exterior surface of the component may comprise the PEO coating.

An exemplary embodiment of an aluminum component 100 with dense oxide coating is shown in FIG. 1A. As shown, the component 100 comprises a substrate 110 with an aluminum or aluminum alloy surface 112, and a layer of pure aluminum 130 on the surface 112. A dense oxide coating 120 is formed on the layer of pure aluminum 130 such that the dense oxide coating, formed using a PEO process, forms an outer surface 124 of the component 100. The substrate 110 may preferably be formed entirely of aluminum or an aluminum alloy (e.g., Al 6061-T6), or alternatively may be formed from a composite of aluminum and other conductive materials, dielectric materials, or insulators wherein at least the surface 112 of the substrate 110 is formed from aluminum or an aluminum alloy. If entirely of aluminum or an aluminum alloy, the substrate 110 can be wrought, extruded, or cast aluminum. Preferably the aluminum alloy can be selected from the Aluminum Association's 1XXX, 2XXX, 3XXX, 4XXX, 5XXX, 6XXX, 7XXX, and 8XXX series of aluminum alloys. Preferably, the surface 112 of the substrate 110 to receive the layer of pure aluminum is non-anodized. In alternative embodiments, the aluminum or aluminum alloy surface 112 may be anodized and/or roughened before the layer of pure aluminum 130 is deposited by cold spraying. In further preferred embodiments, the aluminum or aluminum alloy surface 112 may be polished or machined.

The pure aluminum layer 130 is formed by cold spraying pure aluminum on the aluminum surface 112 of the aluminum substrate 110. Cold spraying is a kinetic spray process utilizing supersonic jets of compressed gas to accelerate near-room temperature powder particles (here, preferably of high purity aluminum) at high velocities, wherein the particles traveling at speeds between about 450 to 1,500 m/sec impact with the substrate (here, the aluminum component being coated using the PEO process) to create a coating. In one embodiment, the particles plastically deform and consolidate on the substrate 110 upon impact. Cold spray may also be referred to as gas dynamic spray, supersonic spray, and/or kinetic spray. The basis of the cold spray process is the gas-dynamic acceleration of particulates (from high purity metal powders) to supersonic velocities (450-1500 m/sec), and hence high kinetic energies, so that solid-state plastic deformation and fusion occur on impact. For example, pure aluminum which has been wrought (fully worked) may have a Brinell Hardness Scale value between about 40 and 45, whereas cold sprayed pure aluminum may have a Brinell Hardness scale value between about 55 and 60. In one embodiment, this may be achieved using convergent-divergent de Laval nozzles, high pressures (up to 500 psi or 3.5 MPa) and flow rates (up to 90 $m^3$/hr) of compressed gases such as helium, argon, or nitrogen. In another embodiment, the gases may be pre-heated to (below the melting point of aluminum, preferably below 120° C.) increase the velocity of the particles of the coating material. In one embodiment, the particles of the metallic bonding material (here, the high purity aluminum) may have a particle diameter ranging from about 1 to about 50 microns, and a particle density ranging from about 2.5 $g/cm^3$ to about 20 $g/cm^3$.

As the gas with which the metal powder forms a gas-powder mixture there is generally used an inert gas. Inert gas according to the embodiments herein includes, but is not limited to argon, helium, or relatively non-reactive nitrogen or mixtures of two or more thereof. In particular cases, air may also be used. If safety regulations are met, also the use of hydrogen or mixtures of hydrogen with other gases would be considered and can be used advantageously due to hydrogen's extremely high sonic velocity. In fact hydrogen's sonic velocity is 30% greater than that of helium which in turn is approximately 3 times that of nitrogen. Air's sonic velocity is 344 m/s at 20° C. and 1 atmosphere (atm), while hydrogen with a lower molecular weight (about 2.016 as compared to air's molecular weight of 28.96) has a sonic velocity of 1308 m/s. The pure aluminum layer cold sprayed on the aluminum component has low porosity. Preferably the pure aluminum layer cold sprayed on the aluminum component has a porosity of less than about 1%, and more preferably, the pure aluminum layer cold sprayed on the aluminum component has a porosity of less than about 0.5%.

The dense oxide coating is formed by subjecting the cold sprayed pure aluminum layer of the aluminum component to a plasma electrolytic oxidation (PEO) process. The PEO process can include submerging the aluminum component in a wet chemistry electrolytic bath at a high voltage (i.e. >200V) wherein the aluminum component forms a first electrode, of an electrochemical cell. A second electrode, which acts as a counter electrode, and completes the electrochemical cell, is preferably a wall of the electrolytic bath. The electrolytic bath is preferably a dilute alkaline solution such as KOH. The voltage applied between the electrodes of the electrolytic bath forms the dense oxide coating on the pure aluminum layer of the aluminum component when the voltage applied to the aluminum component and the pure aluminum layer exceeds the dielectric breakdown potential of a naturally occurring oxide film on an outer surface of the pure aluminum layer. The dielectric breakdown in the electrolytic bath causes microplasmic discharges at the surface and within the pores of the pure aluminum layer wherein arcing within pores of the pure aluminum layer causes the pores to self-heal, thereby reducing the porosity of the pure aluminum layer. Additionally, the microplasmic discharges cause the naturally occurring oxide layer to grow and form a dense oxide coating due to microplasmic discharges causing localized melting of the pure aluminum layer. The melting of the pure aluminum layer in the electrolytic bath forms molten $Al_2O_3$, wherein the molten $Al_2O_3$ can fill the pores of the pure aluminum layer and can also flow from the pores of the pure aluminum layer. The molten $Al_2O_3$ then solidifies as the dense oxide coating (i.e. $Al_2O_3$), self-sealing the pores of the underlying pure Al layer and thereby reducing the porosity of the pure aluminum layer.

The dense oxide coating formed on the pure Al layer has a porosity less than that of the cold sprayed pure aluminum layer. For example, if the pure aluminum layer is cold spray deposited with a porosity of less than about 1%, then the porosity of the dense oxide coating formed using the PEO process is preferably less than about 0.5%, or if the pure aluminum layer is cold spray deposited with a porosity of less than about 0.5%, then the porosity of the dense oxide coating formed using the PEO process is preferably less than about 0.2%. Preferably, the dense oxide coating is formed to a dense α-crystalline form of $Al_2O_3$ such as corundum or sapphire.

The pure aluminum layer 130 is preferably cold sprayed on the aluminum component to a predetermined thickness. Preferably the predetermined thickness is about 0.05 to 3 mm and more preferably about 0.1 to 0.3 mm. The dense oxide coating 120 is then formed on the pure aluminum layer 130 using the PEO process. The surface roughness (Ra) of the dense oxide coating formed using the PEO process is proportional to the thickness of the dense oxide coating. As used herein the term "surface roughness" is represented as an arithmetic mean value (Ra) for the surface roughness measurement. The surface roughness of the dense oxide coating is about 1/10 the thickness of the dense oxide coating formed using the PEO process. Therefore surface roughness can be controlled by forming the dense oxide coating using the PEO process to a predetermined thickness. Preferably the dense oxide coating is about 0.02 to 0.2 mm thick wherein the surface roughness of the dense oxide coating when formed is about 2 to 20 microns.

Figure 1B:
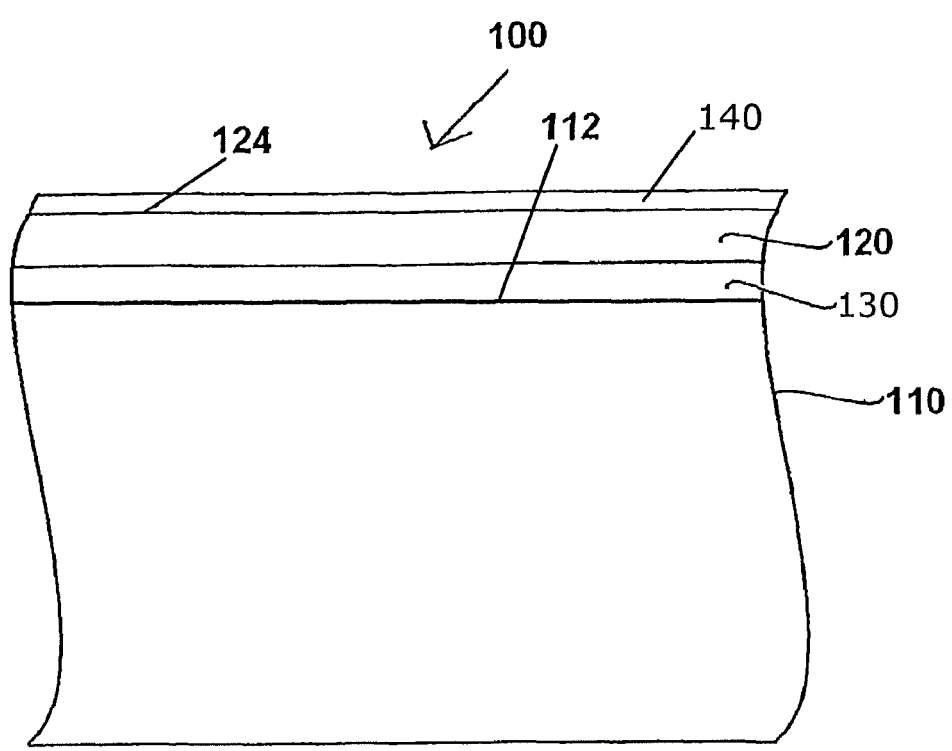

FIG. 1B illustrates a further embodiment of an aluminum component 100 with dense oxide coating. As shown, the component 100 comprises a substrate 110 with an aluminum or aluminum alloy surface 112, and a layer of pure aluminum 130 on the surface 112. A dense oxide coating 120 is formed on the layer of pure aluminum 130 such that the dense oxide coating 120, formed using a PEO process, forms a surface 124 of the component 100. An additional barrier layer 140 is preferably deposited on the surface 124 of the dense oxide coating 120. Preferably the barrier layer 140 is formed of ceramic material, such as yttrium oxide. Preferably, the yttrium oxide is a pure yttrium oxide. The pure yttrium oxide preferably has a purity of at least about 99%, and more preferably from about 99.95% to about 100%. Details of such an arrangement can be found in commonly-assigned U.S. Pat. No. 8,293,335, which is incorporated in its entirety herein by reference. Again the substrate 110 may preferably be formed entirely of aluminum or an aluminum alloy (e.g., AL 6061), or alternatively may be formed from a composite of aluminum and other conductive materials, dielectric materials, or insulators wherein at least the surface 112 of the substrate 110 is formed from aluminum or an aluminum alloy. If entirely of aluminum or an aluminum alloy, the substrate 110 can be wrought, extruded, or cast aluminum. Preferably the aluminum alloy can be selected from the Aluminum Association's 1XXX, 2XXX, 3XXX, 4XXX, 5XXX, 6XXX, 7XXX, and 8XXX series of aluminum alloys.

The barrier layer 140 can be formed directly on the dense oxide coating 120 without prior roughening of the surface 124. In an alternate embodiment the surface 124 may be roughened before the barrier layer 140 is deposited. In a preferred embodiment, the dense oxide coating 120 provides suitable adherence without prior roughening of the surface 124, which obviates additional process steps. Preferably, the dense oxide coating 120 and the barrier layer 140 have a sufficiently-high adhesive bond strength to the respective surfaces 112, 124 of the substrate 110 on which the coatings are formed such that when a tensile bond strength test is performed on the component 100, the dense oxide coating 120 and the barrier layer 140 fail cohesively (i.e., in the substrate bulk of the component) and not adhesively (i.e., at the substrate/coating interfaces). In order to ensure good adhesion of the barrier layer 140 to the dense oxide coating 120, the surface 124 should be thoroughly cleaned from oxide scale, prior to deposition of the barrier layer 140. This cleaning can be carried out by agitating the component 100 in a cleaning solution such as a solution of dilute hydrochloric acid, sulfuric acid, a degreasing solvent, or distilled or deionized water.

Embodiments of the dense oxide coated component may be used in plasma etch chambers or deposition chambers of semiconductor plasma processing apparatuses, such as dielectric etch chambers, capacitively coupled plasma etching chambers, inductively coupled plasma etching chambers, PECVD (plasma enhanced chemical vapor deposition) chambers, and ALD (atomic layer deposition) chambers for example. In these chambers, substrate surfaces can be exposed to plasma and/or process gases. In certain etching processes, these process gases can be halogen-containing species, e.g., $C_xF_y$, $C_xH_yF_z$, HBr, $NF_3$, HBr, $Cl_2$, and $BCl_3$, which are corrosive with respect to certain materials, such as aluminum and aluminum alloy surfaces, wherein said corrosion can release harmful iron contaminates. The dense oxide coating formed using a PEO process, however, can protect the plasma-exposed and/or process gas exposed aluminum or aluminum alloy surfaces from the corrosive effects of the plasma and process gases, thereby reducing iron contamination. Furthermore, the PEO process can reduce harmful contaminates and/or impurities that may be present in the pure aluminum layer. For example, the PEO process may reduce impurities, such as iron impurities found in the pure aluminum layer, when some of the impurities are diffused out from the pure aluminum layer and into a solution of the electrolytic bath as the PEO process transforms the pure aluminum layer into the dense oxide coating. The dense oxide coating may be used to provide, for example, a dense aluminum oxide coating, such as alumina, corundum or sapphire, wherein the dense aluminum oxide coating is preferably in an α-alumina crystalline phase. The plasma-exposed and/or process gas exposed aluminum or aluminum alloy surfaces in the plasma processing apparatus include the dense oxide coating, and more preferably include the barrier layer formed from a material such as yttrium oxide.

Although the dense oxide coating is applicable to any type of component having an aluminum or aluminum alloy surface, for ease of illustration, the coating will be described in more detail with reference to the apparatus described in commonly-assigned U.S. Published Application No. 2009/0200269 which is incorporated herein by reference in its entirety.

FIG. 2 shows an exemplary embodiment of an adjustable gap capacitively-coupled plasma (CCP) etching chamber 200 ("chamber") of a plasma processing apparatus. The chamber 200 comprises chamber housing 202; an upper electrode assembly 225 mounted to a ceiling 228 of the chamber housing 202; a lower electrode assembly 215 mounted to a floor 205 of the chamber housing 202, spaced apart from and substantially parallel to the lower surface of the upper electrode assembly 225; a confinement ring assembly 206 surrounding a gap 232 between the upper electrode assembly 225 and the lower electrode assembly 215; an upper chamber wall 204; a chamber liner 252; and a chamber top 230 enclosing the top portion of the upper electrode assembly 225. In an alternative embodiment, an annular shroud may replace the confinement ring assembly 206 such that the annular shroud surrounds the gap 232 between the upper electrode assembly 225 and the lower electrode assembly 215.

The upper electrode assembly 225 may preferably comprise an upper showerhead electrode 224 and a backing plate 226. The upper electrode assembly 225 may also optionally comprise an outer electrode 224a forming a step surrounding the upper showerhead electrode 224 as well as an optional backing ring 226a forming a step surrounding the backing plate 226. The upper showerhead electrode 224 and backing plate 226 include gas passages for distributing process gas into the gap 232 defined between the upper showerhead electrode 224 and the lower electrode assembly 215. The upper electrode assembly 225 may further optionally comprise a gas distribution system such as one or more baffles (not shown) including gas passages for distributing process gas into the gap 232 defined between the upper showerhead electrode 224 and the lower electrode assembly 215. Details of baffles and shrouds may be found in commonly-assigned U.S. Pat. Nos. 8,313,635, and 6,974,523, incorporated in their entirety herein by reference. The upper electrode assembly 225 can include additional components such as RF gasket 128, a heating element 121, gas nozzle 122, and other parts. The chamber housing 202 has a gate (not shown) through which a substrate 214, is unloaded/loaded into the chamber 200. For example, the substrate 214 can enter the chamber through a load lock as described in commonly-assigned U.S. Pat. No. 6,899,109, which is hereby incorporated by reference in its entirety.

The upper showerhead electrode 224 is preferably formed from a semiconductor compatible material such as single crystal silicon or polysilicon. The gas distribution plate is preferably formed from aluminum or an aluminum alloy. Preferably, the backing plate 226 and showerhead electrode 224 are configured such that they may conduct heat and direct RF current therethrough. Aluminum or aluminum alloy surfaces of the gas distribution plate which are exposed to process gas can be coated with the dense oxide coating to provide a corrosion resistant coating, and are more preferably coated with the dense oxide coating and a ceramic barrier layer such as yttrium oxide.

For brevity, only one gas line 236 connected to gas source 234 is shown in FIG. 2. Additional gas lines can be coupled to the upper electrode assembly 225, and the gas can be supplied through other portions of the upper chamber wall 204 and/or the chamber top 230. Preferably, aluminum components supplying gas to the upper electrode assembly 225 comprise the dense oxide PEO coating.

Process gas injected into the gap 232 is energized to produce plasma to process the substrate 214, passes through the confinement ring assembly 206, and into outer chamber volume 268 until exhausted by the vacuum pump unit 244. Since plasma chamber parts in the outer chamber volume 268 can be exposed to plasma and reactive process gas (radicals, active species) during operation, aluminum or aluminum alloys forming surfaces of said chamber parts may preferably comprise the dense oxide coating formed on the pure aluminum layer, and more preferably the dense oxide coating formed on the pure aluminum layer with the barrier layer, such as a barrier layer of yttrium oxide, deposited on the dense oxide coating such that the chamber parts can withstand the plasma and reactive process gas, thereby reducing possible iron contamination.

In an embodiment the RF power supply 240 supplies RF power to the lower electrode assembly 215 during operation, the RF power supply 240 delivers RF energy via shaft 260 to the lower electrode 210. The process gas in the gap 232 is electrically excited to produce plasma by the RF power delivered to the lower electrode 210.

Plasma chamber components, comprising at least one aluminum or aluminum alloy surface(s) such as an aluminum or aluminum alloy surface of the backing plate 226, backing ring 226a, one or more optional baffles, and at least one aluminum or aluminum alloy surface(s) such as an aluminum or aluminum alloy surface(s) comprised in the lower electrode assembly 215 such as the lower conducting member, the outer conductor rings, the annular shroud, and the chamber liner 252, chamber wall 204, and fasteners may be coated with the dense oxide coating. Any other substrate comprised in the semiconductor plasma processing apparatus having an aluminum or aluminum alloy surface, may also have the dense oxide coating.

Additionally, disclosed herein is a method of plasma processing a semiconductor substrate in a plasma processing apparatus, wherein the plasma processing apparatus includes at least one aluminum component including the dense oxide coating in the processing chamber of the apparatus. The method comprises supplying process gas from a process gas source into the plasma processing chamber, applying RF energy to the process gas using the RF energy source to generate plasma in the plasma processing chamber, and plasma processing a semiconductor substrate in the plasma processing chamber. Preferably the plasma processing of the semiconductor substrate is a plasma etching process or a deposition process.

While the invention has been described in detail with reference to specific embodiments thereof, it will be apparent to those skilled in the art that various changes and modifications can be made, and equivalents employed, without departing from the scope of the appended claims.

What is claimed is:

1. An aluminum component of semiconductor processing equipment comprising:
   a pure aluminum layer on a surface of the aluminum component of the semiconductor processing equipment; and
   a dense oxide coating on the pure aluminum layer wherein the dense oxide coating has been formed using plasma electrolytic oxidation, and wherein the plasma electrolytic oxidation causes the pure aluminum layer to undergo microplasmic discharge forming the dense oxide coating on the aluminum component;
   wherein the pure aluminum layer has a thickness of about 0.05 to 3 mm and the dense oxide coating has a thickness between about 0.02 to 0.2 mm.

2. The aluminum component of claim 1, further comprising a pure yttrium oxide barrier layer on the dense oxide coating wherein the pure yttrium oxide barrier layer has a purity of at least 99%.

3. The aluminum component of claim 1, wherein the aluminum component is at least one of a chamber wall, chamber liner, baffle, gas distribution plate, gas distribution ring, chucking mechanism, edge ring, gas nozzle, fastener, shroud, and confinement ring.

4. The aluminum component of claim 1, wherein (a) the pure aluminum layer has a porosity of less than about 1%; and (b) the dense oxide coating has a porosity of less than about 0.5%.

5. The aluminum component of claim 1, wherein (a) the pure aluminum layer has a porosity of less than about 0.5%; and (b) the dense oxide coating has a porosity of less than about 0.2%.

6. The aluminum component of claim 1, wherein the pure aluminum layer has a thickness of about 0.1 to 0.3 mm.

7. The aluminum component of claim 1, wherein the pure aluminum layer is a pure aluminum layer having by weight at least 99.9% purity and at most 0.1% incidental impurities.

8. The aluminum component of claim 1, wherein the dense oxide coating has a surface roughness of about 2 to 20 microns.

9. An aluminum component of semiconductor processing equipment comprising:
   a pure aluminum layer on a surface of the aluminum component which is configured to be exposed to plasma or process gas during processing of a semiconductor substrate in the semiconductor processing equipment; and
   a dense oxide coating on the pure aluminum layer wherein the dense oxide coating has been formed using plasma electrolytic oxidation, and wherein the plasma electrolytic oxidation causes the pure aluminum layer to undergo microplasmic discharge forming the dense oxide coating on the aluminum component; wherein the pure aluminum layer is a pure aluminum layer having by weight at least 99.9% purity and at most 0.1% incidental impurities.

10. The aluminum component of claim 9, wherein (a) the pure aluminum layer has a thickness of about 0.05 to 3 mm; and (b) the dense oxide coating has a thickness between about 0.02 to 0.2 mm.

11. The aluminum component of claim 9, further comprising a pure yttrium oxide barrier layer on the dense oxide coating wherein the pure yttrium oxide barrier layer has a purity of at least 99%.

12. The aluminum component of claim 9, wherein the dense oxide coating has a surface roughness of about 2 to 20 microns.

\* \* \* \* \*